US007219326B2

(12) United States Patent
Reed et al.

(10) Patent No.: US 7,219,326 B2
(45) Date of Patent: May 15, 2007

(54) PHYSICAL REALIZATION OF DYNAMIC LOGIC USING PARAMETERIZED TILE PARTITIONING

(75) Inventors: Jeffrey B. Reed, Austin, TX (US);
James S. Blomgren, Austin, TX (US);
Donald W. Glowka, Austin, TX (US);
Timothy A. Olson, Austin, TX (US);
Thomas W. Rudwick, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 699 days.

(21) Appl. No.: 10/738,278

(22) Filed: Dec. 16, 2003

(65) Prior Publication Data

US 2005/0060128 A1    Mar. 17, 2005

Related U.S. Application Data

(60) Provisional application No. 60/433,826, filed on Dec. 16, 2002.

(51) Int. Cl.
*G06F 17/50* (2006.01)

(52) U.S. Cl. ............................................. 716/18; 716/5

(58) Field of Classification Search .................... 716/5, 716/7, 18
See application file for complete search history.

(56) References Cited

U.S. PATENT DOCUMENTS 6,539,533 B1* 3/2003 Brown et al. ................. 716/17
6,912,705 B2* 6/2005 Korobkov ..................... 716/11
2003/0121019 A1* 6/2003 Brown et al. ................. 716/12
2005/0060128 A1* 3/2005 Reed et al. .................... 703/1

OTHER PUBLICATIONS

Hill, Dwight D., et al., "Benchmarks for cell synthesis", 27th ACM/IEEE Design Automation Conference, IEEE, 1990., pp. 317-320.*

* cited by examiner

*Primary Examiner*—Stacy A Whitmore
(74) *Attorney, Agent, or Firm*—Matthew J Booth & Associates PLLC; Matthew J Booth (57) ABSTRACT

The matching algorithm of the layout synthesis method and apparatus disclosed locates transistor pattern matches in a design, links a parameterized tile to each identified match, and adjusts certain variable parameters of the linked parameterized tile to meet the physical design requirements of each located match. Each transistor pattern corresponds to a parameterized tile, which is an actual physical representation of the corresponding pattern and includes variable parameters, which may include transistor size. The matching algorithm locates matches in the design for an ordered list of patterns, names each located match, links the proper parameterized tile to each named match, and adjusts the tile's variable parameters as required. Transistors in the design are included in one and only one named located match.

9 Claims, 7 Drawing Sheets

PHYSICAL REALIZATION OF DYNAMIC LOGIC USING PARAMETERIZED TILE PARTITIONING

CROSS REFERENCE TO RELATED APPLICATIONS

This application claims the benefits of the earlier filed U.S. Provisional Application Ser. No. 60/433,826, filed 16 Dec. 2002, which is incorporated by reference for all purposes into this specification.

BACKGROUND OF THE INVENTION

1. Field of the Invention

The present invention relates to the design of semiconductor devices. More specifically, the present invention relates to the use of a transistor pattern matching algorithm to efficiently partition logic on a semiconductor device, wherein each transistor pattern corresponds to a scaleable physical realization of the transistor pattern referred to herein as a parameterized tile.

2. Description of the Related Art

Creating the physical representation of an integrated circuit in an automated fashion is commonly referred to as layout synthesis. The state of the art includes the following methods:

Transistor Synthesis is the method of mapping each transistor in the design into a physical representation of a transistor and placing them into the design. Typically the physical representation has length, width, and possibly folding parameters. The layout synthesis tool takes a cell schematic as input, and outputs a "symbolic layout" for the cell by converting each circuit element, such as a transistor, capacitor, resistor or diode, into predefined geometric shapes or symbols representing a manufacturing plan for the circuit element. The layout synthesis tool also preserves connectivity between the circuit elements represented as symbols in the layout. In a later stage, the symbolic layout of the cell is compacted into a smaller area than it originally occupied, typically based on manufacturing groundrules defined for the desired semiconductor manufacturing technology. The compaction process is designed to increase the density of electronic circuits to the maximum extent permitted by the manufacturing technology. Designing integrated circuits using transistor synthesis methods can be laborious, time-consuming, and error-prone.

Standard Cell Synthesis is the method of mapping the design into a collection of non-parameterized cells. Each cell in the standard cell collection has an associated mapping function. The design is reduced into a collection of these mapping functions. Typically each standard cell has a set pitch so the cells can be placed in row. This method requires extensive libraries of standard cell designs, and layout designers using a standard cell synthesis method often find that predesigned library cells are either not available or not optimal for certain areas of the design. Accordingly, although automated standard cell synthesis methods are generally less labor-intensive than transistor synthesis methods, a substantial amount of human intervention is often required to achieve an optimized design.

Tile Synthesis is the method of mapping the design into a collection of non-parameterized tiles. The tiles are mapped generally by name. Tile synthesis favors a design that instantiates a limited set of cells like a RAM design. Like standard cell synthesis, tile synthesis is a less laborious automatic layout method than transistor synthesis, but tile synthesis methods do not provide for design flexibility, due to limited tile design choices and fixed device sizes.

An ideal layout methodology would combine the advantages of all of these methods while eliminating the disadvantages. While the transistor synthesis method enables substantial design flexibility, particularly in sizing individual devices, it is labor-intensive and can result in inefficient logic partitioning and routing problems. Standard cell synthesis and tile synthesis are much less laborious and enable more efficient partitioning and inter-cell routing, but design flexibility is sacrificed.

The present invention combines the best aspects of these methods by providing an automatic layout methodology that uses a collection of parameterized tiles. Each tile consists of geometric shapes representing the physical design of a pattern. Some of the coordinates of each tile are variable and are said to be parameterized. Thus a single parameterized tile can support a variety of device widths, device lengths, wire widths, etc.

Each tile has a corresponding network of connected devices. This network is referred to as a pattern. The design is mapped to an ordered list of these patterns. When a pattern match is obtained the matching topology is checked for appropriate parameter range for each device. The goal is to partition the design into an optimum number of patterns. Each device in the design must be covered by one and only one device in a pattern.

SUMMARY OF THE INVENTION

The present invention is a layout synthesis method and apparatus wherein a matching algorithm locates matches for one or more patterns in a design, links a parameterized tile to each match, and adjusts certain variable parameters of the linked parameterized tile to meet the physical design requirements of each located match. Practitioners of the present invention identify patterns that comprise an interconnection of one or more transistors and one or more ports. Each pattern corresponds to a parameterized tile, which is an actual physical representation of the corresponding pattern and includes one or more variable parameters. The matching algorithm locates matches in the design for patterns selected in a predetermined order, names each located match, links the parameterized tile corresponding to each pattern matched to each named located match, and adjusts the variable parameters of the linked parameterized tile to meet the physical design requirements of each located match. In one embodiment, one of the variable parameters of the parameterized tile is the size of the transistors in the tile, which are adjustable by varying the horizontal width of the transistor diffusion layer on the parameterized tile or the vertical height of the transistor diffusion layer according to a predetermined adjustment range. Transistors in the design are included in one and only one named located match. In a preferred embodiment, the matching algorithm locates and names a sufficient number of pattern matches such that every transistor in the design is included in one and only one named match.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention is an automatic integrated circuit layout methodology and apparatus therefore that uses a collection of parameterized tiles. This disclosure describes numerous specific details that include specific structures, circuits, and logic functions in order to provide a thorough understanding of the present invention. One skilled in the art will appreciate that one may practice the present invention without these specific details. In addition, the present invention is described herein in the context of the layout of an integrated circuit implemented in N-Nary logic. Those skilled in the art will understand that the present invention is not limited to use with N-Nary logic designs, but can be applied to any static or dynamic logic design. Notwithstanding, given that the circuit and schematic examples shown herein are circuits implemented in N-Nary logic, readers unfamiliar with N-Nary logic may find the following brief discussion of the N-Nary logic design approach and logic family useful.

N-Nary logic, also known as NDL logic, is a new dynamic logic family developed by Intrinsity Inc. (f/k/a EVSX Inc.), the Assignee of this application. Intrinsity's N-Nary-related technology is trademarked under the name FAST14, and circuits implemented in Nnary logic are denoted as "NDL gates" "NDL circuits" and "NDL designs", all implemented in "FAST14 technology." N-Nary logic and the N-Nary design style are described in U.S. Pat. No. 6,066,965, entitled "Method and Apparatus for a N-Nary logic Circuit Using 1-of-4 Signals", which is hereinafter referred to as the "NDL Patent." As described in detail in the NDL Patent, NDL logic supports a variety of 1-of-N signal encodings, including 1-of-4. In 1-of-4 encoding, four wires are used to indicate one of four possible values. In contrast, traditional static logic design uses two wires to indicate four values, as is demonstrated in Table 1. In Table 1, the $A_0$ and $A_1$ wires are used to indicate the four possible values for operand A: 00, 01, 10, and 11. Table 1 also shows the decimal value of an encoded 1-of-4 signal corresponding to the two-bit operand value, and the methodology by which the value is encoded using four wires.

TABLE 1

| 2-bit operand value | | N-NARY (1-of-4) Signal A Decimal Value | N-NARY (1-of-4) Signal A 1-of-4 wires asserted | | | |
|---|---|---|---|---|---|---|
| $A_1$ | $A_0$ | A | A[3] | A[2] | A[1] | A[0] |
| 0 | 0 | 0 | 0 | 0 | 0 | 1 |
| 0 | 1 | 1 | 0 | 0 | 1 | 0 |
| 1 | 0 | 2 | 0 | 1 | 0 | 0 |
| 1 | 1 | 3 | 1 | 0 | 0 | 0 |

In addition, the NDL Patent also shows a number of basic Boolean devices implemented in FAST14 technology, including OR/NOR gates, AND/NAND gates, XOR/Equivalence gates, and Muxes. Additional, more complex NDL logic elements, features, and principles are further described in U.S. Pat. No. 6,219,686 (Sum/HPG Adder/Subtractor Gate), U.S. Pat. No. 6,324,239 (Shifter), and U.S. Pat. No. 6,269,387 (3-Stage 32-Bit Adder).

Figure 1:
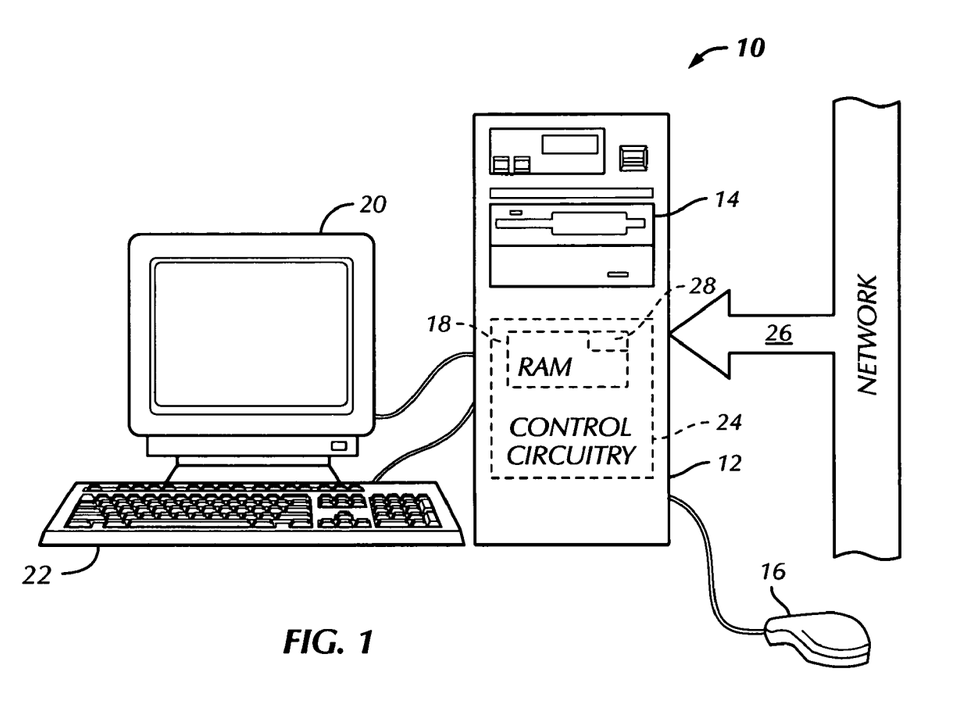
FIG. 1 shows a standard computer workstation 10 of the type commonly used and suitable for hardware and software design, simulation, verification, layout synthesis, and other activities.

FIG. 1 shows a standard computer workstation 10 of the type commonly used and suitable for hardware and software design, simulation, verification, layout synthesis, and other activities. The computer workstation 10 shown in FIG. 1 is suitable for practicing the present invention discussed herein, and may also incorporate software programs that utilize the present invention. As shown in FIG. 1, the workstation 10 comprises a monitor 20 and keyboard 22, a processing unit 12, and various peripheral interface devices that might include removable media local storage 14 and a mouse 16. Processing unit 12 further includes internal memory 18, and internal storage (not shown in FIG. 1) such as a hard drive.

Workstation 10 interfaces with digital control circuitry 24 and executable software 28 that may include, for example, device design and layout software if the computer workstation 10 is functioning as a device design and layout workstation. In the preferred embodiment shown in FIG. 1, digital control circuitry 24 is a general-purpose computer including a central processing unit, RAM, and auxiliary memory. Both the executable software 28 and the digital control circuitry 24 are shown in FIG. 1 as residing within processing unit 12 of workstation 10, but both components could be located in whole or in part elsewhere, and interface with workstation 10 over connection 26 or via removable media local storage 14. As shown in FIG. 1, connection 26 could be a connection to a network of computers or other workstations, which could also be connected to printers, external storage, additional computing resources, and other network peripherals. One skilled in the art will recognize that the present invention can be practiced upon any of the well known specific physical configurations of standalone or networked design workstations.

The operator interfaces with digital control circuitry 24 and the software 28 via the keyboard 22 and/or the mouse 16. Control circuitry 24 is capable of providing output information to the monitor 20, the network interface 26, and a printer (not shown in FIG. 1).

Figure 2:
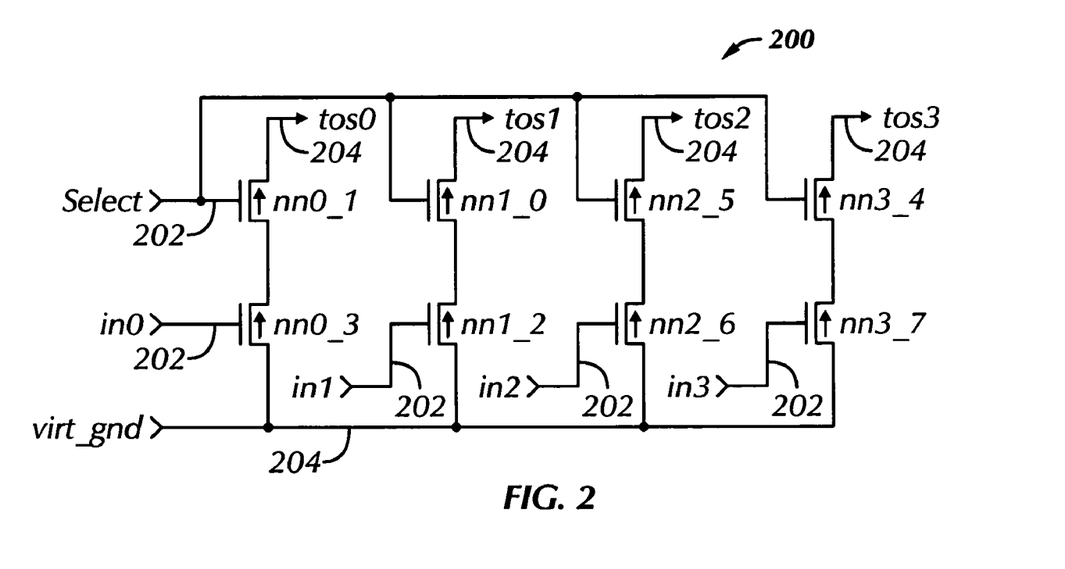
FIG. 2 shows an 8-transistor mux pattern 200 commonly found in many NDL logic designs.

As described above, the present invention is an automatic integrated circuit layout methodology and apparatus therefore that uses a collection of parameterized tiles. Each tile has a corresponding network of connected devices, referred to herein as a pattern. For example, FIG. 2 shows a pattern 200 commonly found in many NDL logic designs, an 8-transistor mux. The two signal inputs to this cell (collectively shown as 202) are a 1-of-4 input signal "in", and a select signal. The transistors' sources and drains are connected to virtual ground and the top of stack nodes tos0, tos1, tos2, and tos3, collectively designated as 204.

Figure 3:
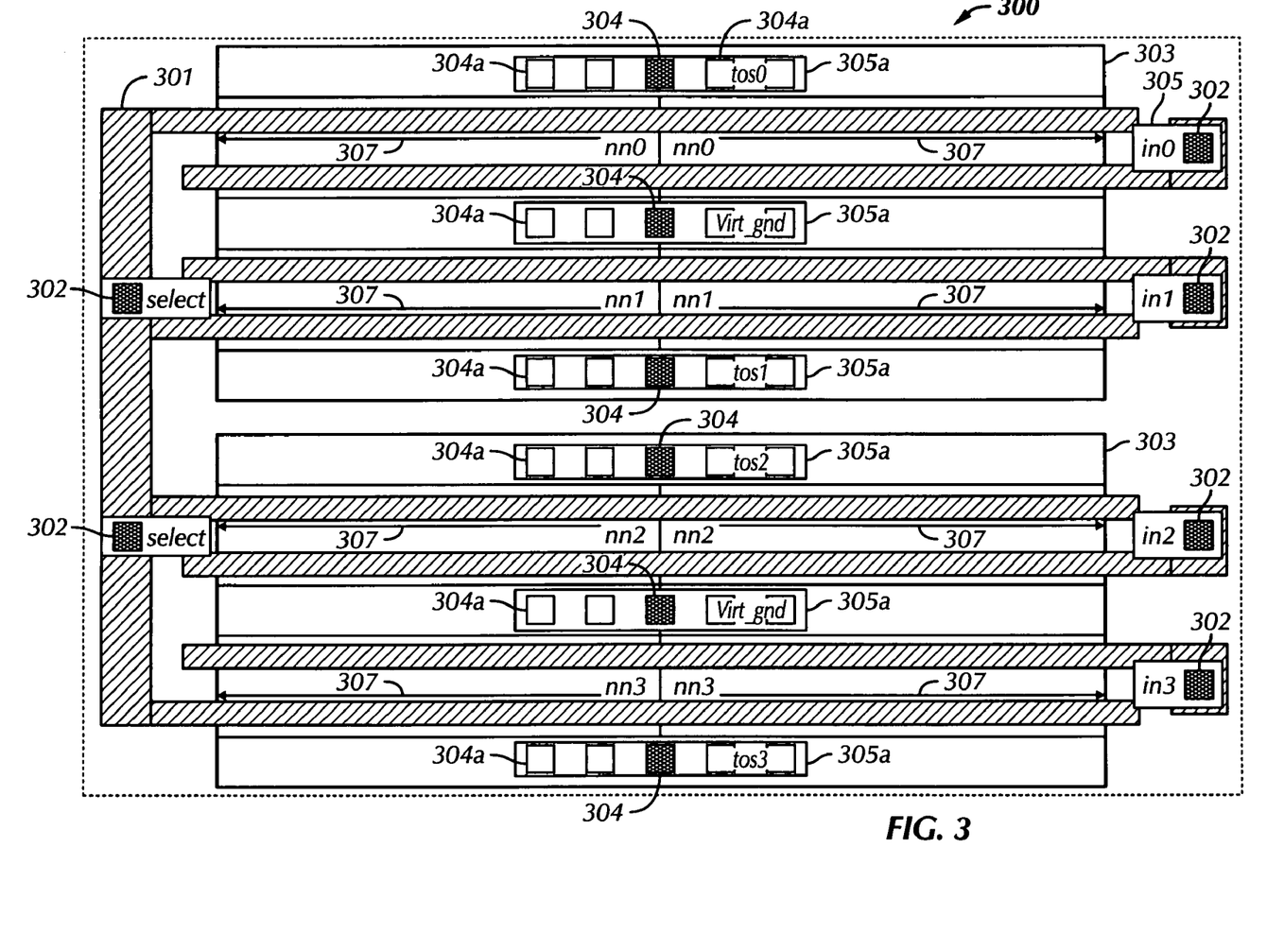
FIG. 3 shows the parameterized tile 300 associated with the FIG. 2 pattern.

FIG. 3 is the parameterized tile 300 associated with the FIG. 2 pattern. The parameterized tile comprises an actual physical representation of the pattern, as it would be implemented in silicon. The square contacts 302 around the perimeter of the tile are the tile's port contacts encompassed on a metal layer 305. Contacts 302 are used for interconnecting the tile into the circuit during routing. Contacts 302 interface with the transistor gates, which is the polysilicon layer shown as crosshatched bars 301 that run horizontally across the tile over the diffusion layer 303 that comprises the sources and drains of the transistors on the tile 300.

The tile shown in FIG. 3 is said to be parameterized because the transistor width can be controlled in the horizontal direction, as indicated by growth arrows 307 in the diffusion layer 303. In this case, for smaller transistors, the vertical height of the diffusion layer 303 stays fixed, and the diffusion layer can be made smaller in the horizontal direction as required. Metal contacts 304 in a metal layer 305a enable the interconnection of the transistor drains to the top of stack nodes and the transistor sources to the virtual ground node. As shown in FIG. 3, designers may choose to implement additional optional metal contacts 304a to the sources and drains of the transistors, depending upon the final transistor size selected. After reading this specification or practicing the present invention, those skilled in the art will understand that other physical aspects of tiles in addition to transistor widths can be parameterized, including, for example, transistor lengths, conductor widths, and contact numbers and areas. Similarly, designers may choose to implement tiles with diffusion areas or other physical aspects of the tile fixed in vertical height and having variable horizontal width as shown in the example tile 300, or fixed in horizontal width having variable vertical height, or variable in both width and height, or capable of internal variations such as contact numbers, areas, or locations that may not affect either the overall width or height of the tile.

Figure 4A:
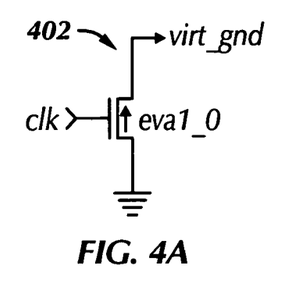
FIGS. 4A–4F show a variety of patterns common to NDL-implemented designs.
Figure 4B:
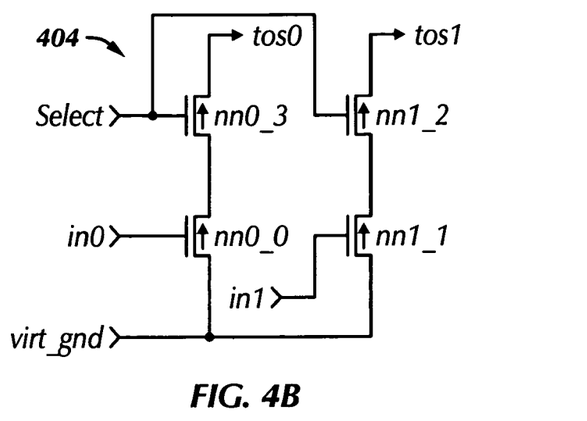
Figure 4C:
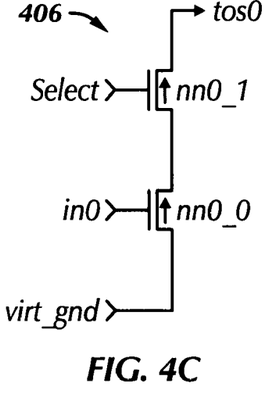
Figure 4D:
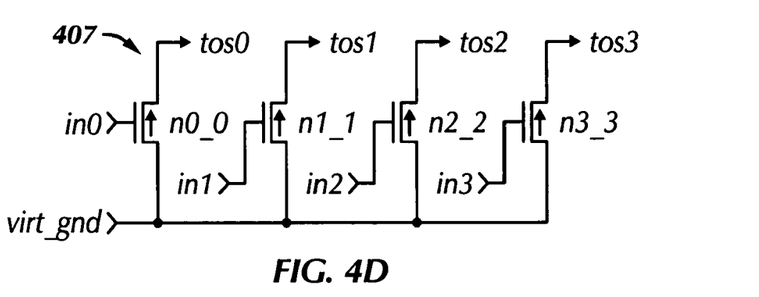
Figure 4E:
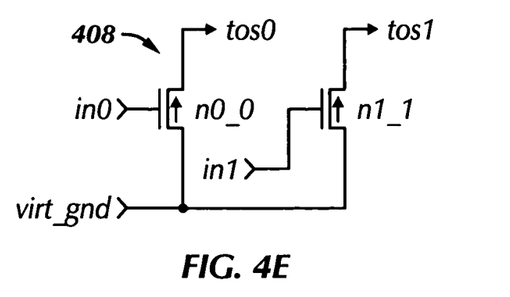
Figure 4F:
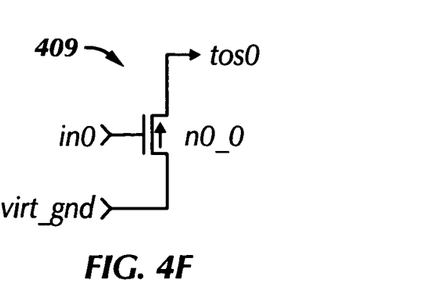

In general, NDL design enables us to organize the patterns into 3 basic categories, output buffers, nstacks, and evals. FIGS. 4A–4F show a variety of patterns common to NDL-implemented designs. FIG. 4A is the evaluation circuit pattern 402 found in virtually every NDL gate. FIG. 4B is a 4-transistor mux pattern 404; FIG. 4C is a 2-transistor mux pattern 406; FIG. 4D is a 4-transistor nstack pattern 407; FIG. 4E is a 2-transistor nstack pattern 408; and FIG. 4F is a 1-transistor nstack pattern 409. Static gate patterns can easily be supported by either defining a separate pattern list or by placing the static gate patterns on top.

Figure 5A:
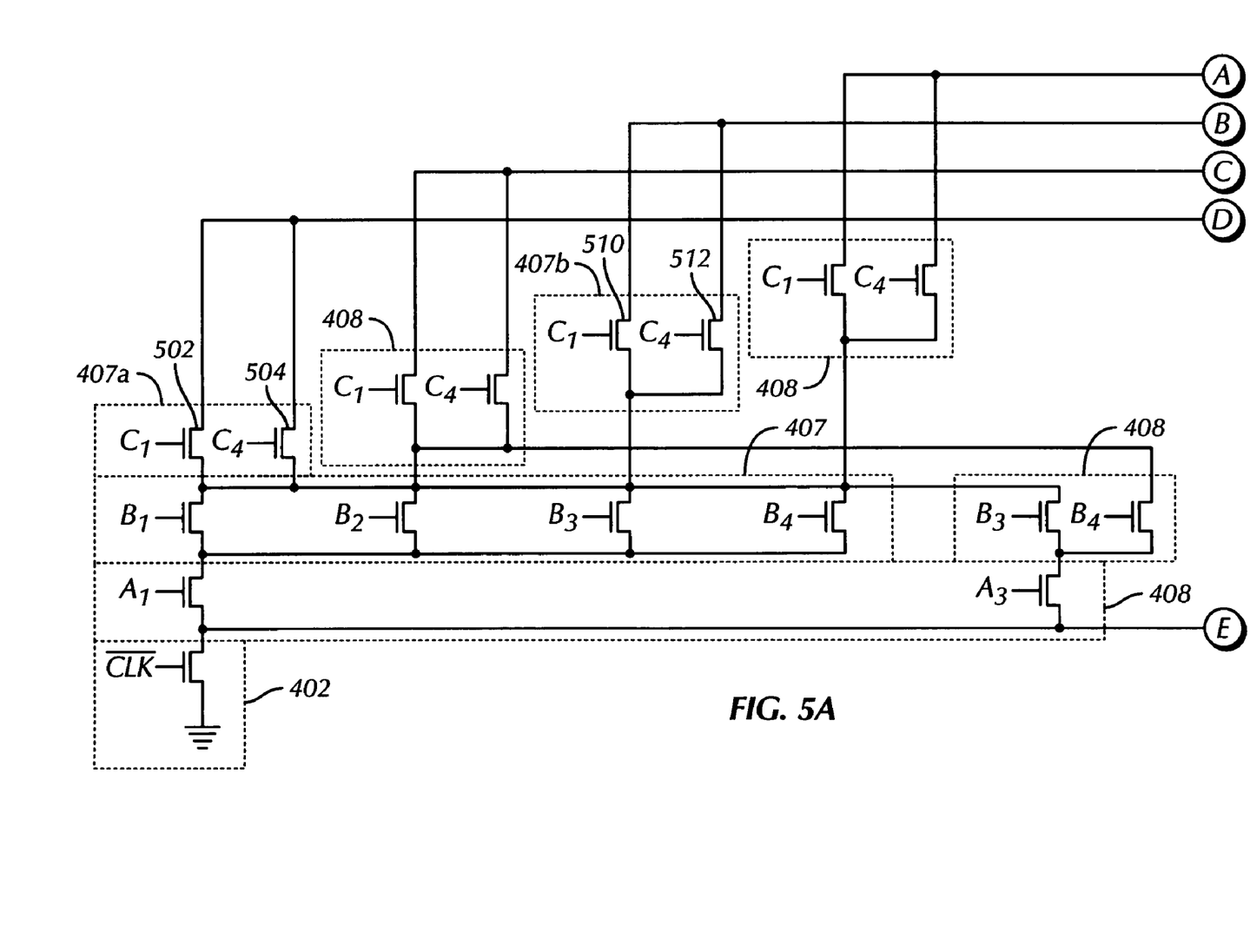
FIGS. 5A and 5B show an NDL design that has been segregated into a collection of patterns.
Figure 5B:
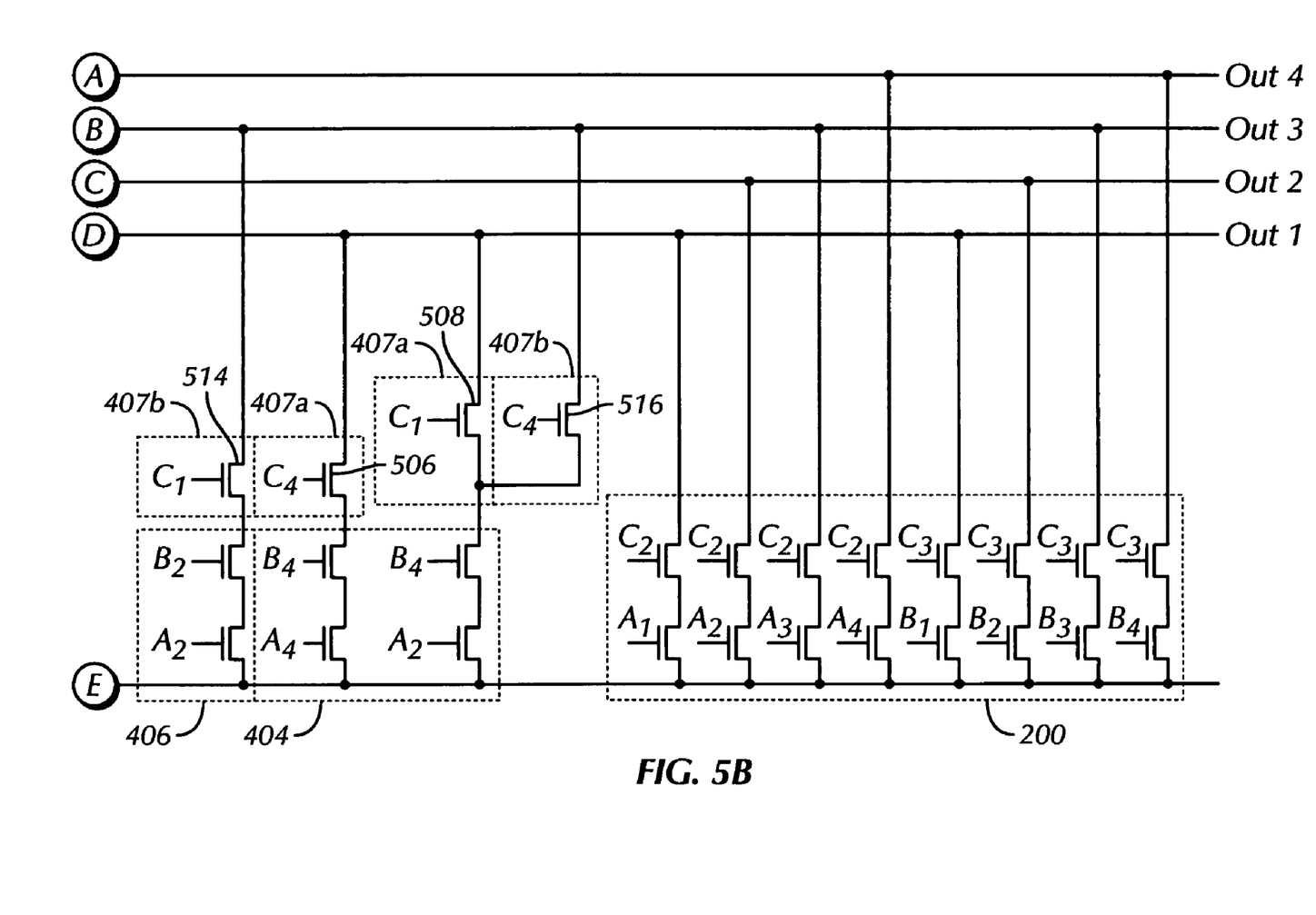

FIGS. 5A and 5B show a design that has been segregated into a collection of patterns. The pattern match method of the present invention selects each pattern from an ordered list of patterns and searches the design for as many matches as possible. In one embodiment, the preferred order for pattern matching is as follows: eval pattern 402, followed by the 8-transistor mux pattern 200 (from FIG. 2), followed by the 4-transistor mux pattern 404, followed by the 2-transistor mux pattern 406, followed by the three nstack patterns 407, 408, and 409, in that order. In FIG. 5A, we see that the eval pattern 402 was found at the lower left. The 8-transistor mux pattern 200 was found in FIG. 5B at the lower right. One 4-transistor mux pattern 404 and one 2-transistor mux pattern 406 were found in FIG. 5B. Three 4-transistor nstacks patterns were found, designated as 407 in FIG. 5A, and 407a, and 407b found in both FIGS. 5A and 5B (407a and 407b are explained in further detail below). Finally, the present invention identified two 2-transistor nstack patterns 408.

Note that in FIG. 5A, transistor 502 gated by signal C1 and transistor 504 gated by signal C4 have been collectively identified as pattern 407a. However, pattern 407 is a 4-transistor nstack. The remaining two transistors that "belong" to this pattern appear in FIG. 5B: transistor 506 gated by signal C4 and transistor 508 gated by signal C1. Transistors 506 and 508 are identified in FIG. 5B as belonging to pattern 407a.

This example illustrates two important points. First, transistors do not have to be conveniently visually arranged on a schematic in an immediately recognizable pattern for the present invention to identify a pattern match. Second, in this embodiment, there is no "right side up" when matching patterns; instead of the sources of transistors 502, 504, 506, and 508 being connected together, as shown in pattern 407 in FIG. 4D, the drains are all connected to output node "out1" and the sources are connected to other nodes. Consequently, pattern 407a actually appears "upside down" as compared to the 4-transistor nstack pattern shown in FIG. 4D. The matching criteria implemented in identifying matches for this design enables "upside down" pattern matching, where the transistor drains are connected together instead of the sources. Matching criteria is discussed in further detail below.

Returning to FIGS. 5A and 5B, we see that the present invention matched another "upside down" 4-transistor nstack pattern split across the design, comprising transistors 510, 512, 514, and 516. These four transistors are collectively identified as 407b. Once again, this is an "upside down" match, as the transistor drains are all connected to node "out3" and the transistor sources connect to other nodes.

Figure 6:
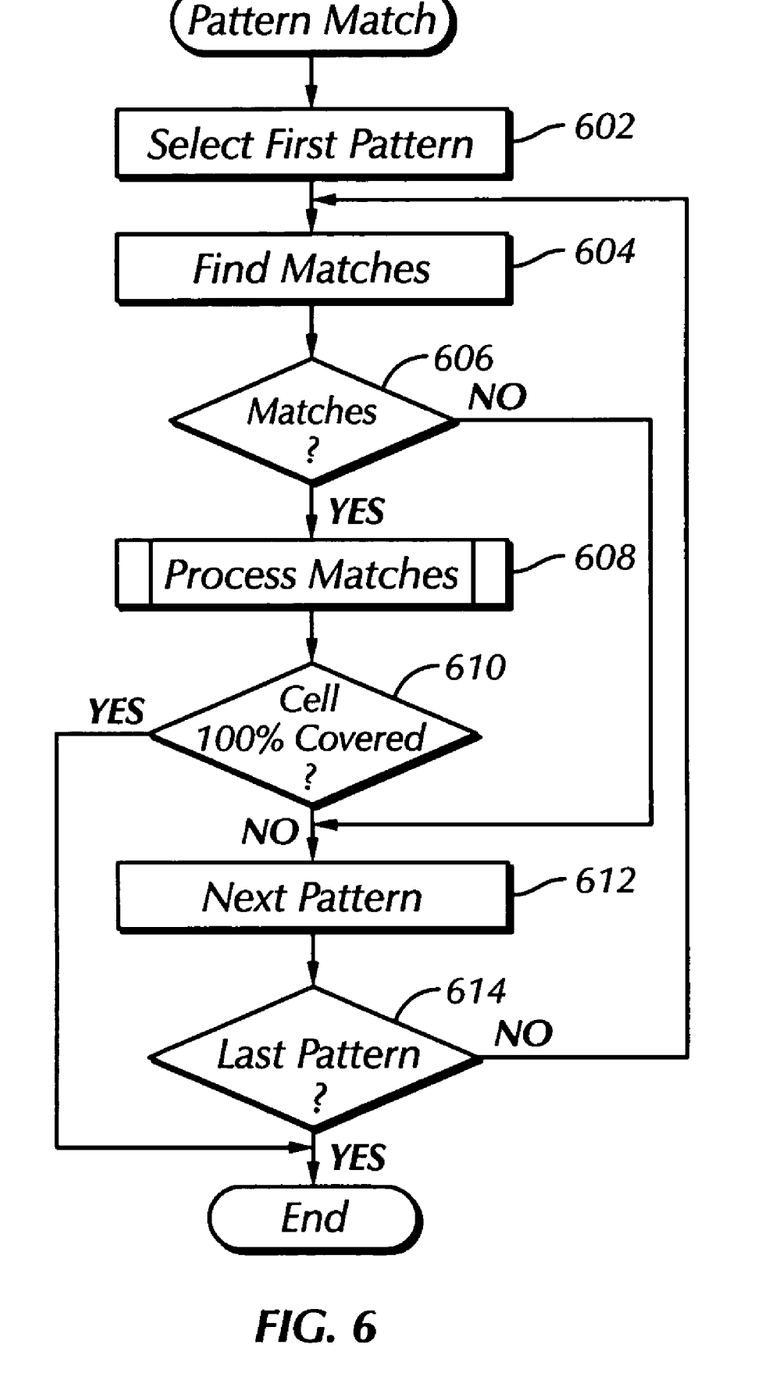
FIG. 6 shows a flowchart of the pattern matching algorithm of the present invention.

FIG. 6 shows a flowchart of the pattern matching algorithm of the present invention. At 602, we start the pattern matching algorithm by selecting the first pattern in the list. The order of the list is significant. It is important to attempt matches for more complex patterns first. Larger patterns generally require less routing resources and are more compact. Smaller patterns may also cover devices that would have been matched by a larger pattern. Failing to identify large patterns first can cause inefficient tile selection or a failure to cover the entire design.

At 604 and 606, the present invention attempts match the currently selected pattern in as many locations as possible within the design. For each match found, a device name map is generated. The device name map is used down stream to validate the match and to mark the devices covered by the match.

The match criteria can have a variety of rules. For instance, pattern nets attached to ports can match a net in the design where the port instance count is greater as long as a match is found. Pattern nets that are not attached to ports must match the port instance count exactly. Another rule might require that global pattern nets like vdd and gnd match the exact net names in the design. In some situations it might be advantageous to declare a match even though a pattern has swapped source and drain connections, as was the case with the two 4-transistor nstack patterns 407a and 407b matched in the design shown in FIGS. 5A and 5B. These types of match criteria can be extended in different ways to produce matches for a variety of situations.

Continuing with FIG. 6, at 608, the selected pattern has been matched one or more times within the design, and each topological match found has a device name mapping assigned at 604. At 608, the device name mappings are used to obtain the exact sizes of each device in the design. The pattern name and sizes for each device in the pattern is then provided to a layout generator. If the layout generator has a parameterized tile corresponding to the pattern that supports the required device sizes, then the design devices are marked as matched and the identified parameterized tile is linked to the named match. If the layout generator cannot support the particular match, the algorithm continues on as if the match had never been made.

Those skilled in the art will understand that the size validation process at 608 can be extended to check for other constraints of particular concern, such as electromigration or IR drop violations.

At 610, 612, and 614 checks are made to ascertain whether all of the devices in the design have been matched with patterns. If not, the process continues with the next pattern in the ordered list. The algorithm ends once all of the devices in the design have been associated with a pattern. A failure occurs if all patterns on the list are exhausted without achieving 100% coverage of all the devices in the design. After reading this specification or practicing the present invention, those skilled in the art will understand that if a single-transistor pattern is the last pattern identified for matching on the ordered list, then 100% coverage should be readily achievable.

The output is a list of parameterized tiles that comprise generated physical views, device maps, and net maps. These outputs are sufficient data for placing and routing the generated physical views.

In sum, the present invention is a layout synthesis method and apparatus wherein a matching algorithm locates matches for one or more patterns in a design, links a parameterized tile to each match, and adjusts certain variable parameters of the linked parameterized tile to meet the physical design requirements of each located match. Practitioners of the present invention identify patterns that comprise an interconnection of one or more transistors and one or more ports. Each pattern corresponds to a parameterized tile, which is an actual physical representation of the corresponding pattern and includes one or more variable parameters. The matching algorithm locates matches in the design for patterns selected in a predetermined order, names each located match, links the parameterized tile corresponding to each pattern matched to each named located match, and adjusts the variable parameters of the linked parameterized tile to meet the physical design requirements of each located match. In one embodiment, one of the variable parameters of the parameterized tile is the size of the transistors in the tile, which are adjustable by varying the horizontal width of the diffusion area of the parameterized tile or the vertical height of the diffusion area according to a predetermined adjustment range. Transistors in the design are included in one and only one named located match. In a preferred embodiment, the matching algorithm locates and names a sufficient number of pattern matches such that every transistor in the design is included in one and only one named match.

Other embodiments of the invention will be apparent to those skilled in the art after considering this specification or practicing the disclosed invention. The specification and examples above are exemplary only, with the true scope of the invention being indicated by the following claims.

We claim the following invention:

1. A method to make an integrated circuit using a layout synthesis apparatus, comprising:
   providing one or more patterns, wherein each pattern comprises an interconnection of one or more transistors and one or more ports;
   providing a parameterized tile corresponding to each said pattern, wherein said parameterized tile further comprises an actual physical representation of said corresponding pattern having one or more variable parameters; and
   providing a matching algorithm that locates a match for one or more said patterns in a design, names each located match, links said parameterized tile corresponding to each said pattern matched to each named located match, and adjusts said variable parameters of the linked parameterized tile to meet the physical design requirements of said located match.

2. A method to use a layout synthesis apparatus, comprising:
   identifying one or more patterns, wherein each pattern comprises an interconnection of one or more transistors and one or more ports;
   associating a parameterized tile to each said pattern, wherein said parameterized tile further comprises an actual physical representation of said corresponding pattern having one or more variable parameters; and
   locating a match for one or more said patterns in a design using a matching algorithm that names each located match, links said parameterized tile corresponding to each said pattern matched to each named located match, and adjusts said variable parameters of the linked parameterized tile to meet the physical design requirements of said located match.

3. A program storage device readable by a computer that tangibly embodies a program of instructions executable by the computer to perform a method to use a layout synthesis apparatus, comprising:
   identifying one or more patterns, wherein each pattern comprises an interconnection of one or more transistors and one or more ports;
   associating a parameterized tile to each said pattern, wherein said parameterized tile further comprises an actual physical representation of said corresponding pattern having one or more variable parameters; and
   locating a match for one or more said patterns in a design using a matching algorithm that names each located match, links said parameterized tile corresponding to each said pattern matched to each named located match, and adjusts said variable parameters of the linked parameterized tile to meet the physical design requirements of said located match.

4. A dependent claim according to claim 1, 2, or 3, wherein one of said variable parameters of said parameterized tile further comprises the size of said transistors, adjustable by varying one of the following: the horizontal width of the transisitor diffusion layer on said parameterized tile, or the vertical height of the transistor diffusion layer on said parameterized tile.

5. A dependent claim according to claim 1, 2, or 3, wherein said matching algorithm further selects said patterns for locating pattern matches in a predetermined order.

6. A dependent claim according to claim 1, 2, or 3, wherein said matching algorithm locates and names a sufficient number of pattern matches such that every transistor in the design is included in one and only one named located match.

7. A method to make an integrated circuit using a layout synthesis apparatus, comprising:
   providing one or more patterns, wherein each pattern comprises an interconnection of one or more transistors and one or more ports;
   providing a parameterized tile corresponding to each said pattern, wherein said parameterized tile further comprises an actual physical representation of said corresponding pattern having one or more variable parameters; and
   providing a matching algorithm that locates a match in a design for one or more said patterns selected for matching in a predetermined order, names each located match, links said parameterized tile corresponding to each said pattern matched to each named located match, and adjusts said variable parameters of the linked parameterized tile to meet the physical design requirements of said located match;

wherein one of said variable parameters of said parameterized tile further comprises the size of said transistors, adjustable by varying one of the following: the horizontal width of the transistor diffusion layer on said parameterized tile, or the vertical height of the transistor diffusion layer on said parameterized tile; and wherein said matching algorithm locates and names a sufficient number of pattern matches such that every transistor in the design is included in one and only one named located match.

8. A method to use a layout synthesis apparatus, comprising:

identifying one or more patterns, wherein each pattern comprises an interconnection of one or more transistors and one or more ports;

associating a parameterized tile with each said pattern, wherein said parameterized tile further comprises an actual physical representation of said corresponding pattern having one or more variable parameters; and locating a match for one or more said patterns in a design using a matching algorithm a matching algorithm that selects patterns for matching in a predetermined order, names each located match, links said parameterized tile corresponding to each said pattern matched to each named located match, and adjusts said variable parameters of the linked parameterized tile to meet the physical design requirements of said located match;

wherein one of said variable parameters of said parameterized tile further comprises the size of said transistors, adjustable by varying one of the following: the horizontal width of the transistor diffusion layer on said parameterized tile, or the vertical height of the transistor diffusion layer on said parameterized tile; and wherein said matching algorithm locates and names a sufficient number of pattern matches such that every transistor in the design is included in one and only one named located match.

9. A program storage device readable by a computer that tangibly embodies a program of instructions executable by the computer to perform a method to use a layout synthesis apparatus, comprising:

identifying one or more patterns, wherein each pattern comprises an interconnection of one or more transistors and one or more ports;

associating a parameterized tile with each said pattern, wherein said parameterized tile further comprises an actual physical representation of said corresponding pattern having one or more variable parameters; and locating a match for one or more said patterns in a design using a matching algorithm a matching algorithm that selects patterns for matching in a predetermined order, names each located match, links said parameterized tile corresponding to each said pattern matched to each named located match, and adjusts said variable parameters of the linked parameterized tile to meet the physical design requirements of said located match;

wherein one of said variable parameters of said parameterized tile further comprises the size of said transistors, adjustable by varying one of the following: the horizontal width of the transistor diffusion layer on said parameterized tile, or the vertical height of the transistor diffusion layer on said parameterized tile; and wherein said matching algorithm locates and names a sufficient number of pattern matches such that every transistor in the design is included in one and only one named located match.

* * * * *

UNITED STATES PATENT AND TRADEMARK OFFICE
CERTIFICATE OF CORRECTION

| | | |
|---|---|---|
| PATENT NO. | : 7,219,326 B2 | Page 1 of 1 |
| APPLICATION NO. | : 10/738278 | |
| DATED | : May 15, 2007 | |
| INVENTOR(S) | : Jeffrey B. Reed et al. | |

It is certified that error appears in the above-identified patent and that said Letters Patent is hereby corrected as shown below:

On the face page, in field (75), in "Inventors", in column 1, line 5, delete "Rudwick," and insert -- Rudwick III, --, therefor.

In column 3, line 37, delete "Nnary" and insert -- N-nary --, therefor.

In column 8, line 39, in Claim 4, delete "transisitor" and insert -- transistor --, therefor.

In column 9, line 21, in Claim 8, after "algorithm" delete "a matching algorithm".

In column 10, line 15, in Claim 9, after "algorithm" delete "a matching algorithm".

Signed and Sealed this
Twenty-ninth Day of November, 2011

David J. Kappos
*Director of the United States Patent and Trademark Office*